United States Patent
Lee et al.

(10) Patent No.: US 9,792,999 B2
(45) Date of Patent: Oct. 17, 2017

(54) ADAPTIVE SCHEME FOR INCREMENTAL STEP PULSE PROGRAMMING OF FLASH MEMORY

(71) Applicant: SK Hynix Inc., Gyeonggi-do (KR)

(72) Inventors: June Lee, Sunnyvale, CA (US); Yan Zhang, Milpitas, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/335,413

(22) Filed: Oct. 26, 2016

(65) Prior Publication Data

US 2017/0125118 A1    May 4, 2017

Related U.S. Application Data

(60) Provisional application No. 62/248,940, filed on Oct. 30, 2015.

(51) Int. Cl.
G11C 16/04    (2006.01)
G11C 16/34    (2006.01)
G11C 11/56    (2006.01)

(52) U.S. Cl.
CPC ...... *G11C 16/3459* (2013.01); *G11C 11/5628* (2013.01)

(58) Field of Classification Search
CPC .................. G11C 16/3459; G11C 11/5628
USPC .................................................. 365/185.03
See application file for complete search history.

(56) References Cited

U.S. PATENT DOCUMENTS

| | | | |
|---|---|---|---|
| 5,812,457 A | 9/1998 | Arase | |
| 5,841,457 A | 11/1998 | Bergen | |
| 7,800,946 B2 * | 9/2010 | Kim ...................... | G11C 16/10 365/185.11 |
| 8,154,929 B2 * | 4/2012 | Kang ...................... | G11C 7/02 365/185.09 |
| 8,243,518 B2 | 8/2012 | Oh | |
| 8,593,881 B2 * | 11/2013 | Horesh .................... | G11C 7/12 365/185.13 |
| 8,665,649 B2 | 3/2014 | Park | |
| 9,154,929 B2 * | 10/2015 | Cormier .................. | H04W 4/20 |
| 9,263,141 B2 * | 2/2016 | Chang .................... | G11C 16/14 |
| 9,299,441 B2 | 3/2016 | Lee | |
| 2007/0070701 A1 | 3/2007 | Kim | |
| 2011/0138111 A1 | 6/2011 | Kim | |
| 2013/0124787 A1 | 5/2013 | Schuette | |
| 2013/0258780 A1 | 10/2013 | Khouri | |
| 2013/0329502 A1 | 12/2013 | Kang | |

* cited by examiner

*Primary Examiner* — Pho M Luu
(74) *Attorney, Agent, or Firm* — Kilpatrick Townsend & Stockton LLP

(57) ABSTRACT

According to an adaptive programming method for flash memories, the cell programming speed is detected by programming a number of cells using a fixed trial program voltage. A starting program voltage $V_{start}$ is then adjusted based on the detected cell programming speed. The ISPP is then carried out using the adjusted value for $V_{start}$.

13 Claims, 6 Drawing Sheets

ADAPTIVE SCHEME FOR INCREMENTAL STEP PULSE PROGRAMMING OF FLASH MEMORY

CROSS-REFERENCES TO RELATED APPLICATIONS

This application claims the benefit of U.S. provisional application No. 62/248,940 filed Oct. 30, 2015, titled "ADAPTIVE SCHEME FOR INCREMENTAL STEP PULSE PROGRAMMING OF NAND MEMORY," which is incorporated herein by reference.

BACKGROUND

With the continued flash memory scaling, particularly, NAND flash technology scaling, the conventional use of a fixed starting program voltage ($V_{start}$) throughout the life cycle of a NAND flash memory device results in inefficient programming. Incremental Step Pulse Programming (ISPP) is a commonly used NAND program method to achieve balance between $V_{th}$ distribution and program time (tPROG). FIG. 1 illustrates the ISPP scheme, and FIG. 2 shows the four threshold voltage distributions for a 2-bit per cell flash memory where $L_0$ represents the erased state and $L_1$, $L_2$ and $L_3$ represent 3 program states. The ISPP starts by applying a relatively low starting program voltage $V_{start}$ followed by a program verify PV operation. After that, the program voltage is increased by $V_{step}$ and another programing/verifying operation is carried out. This process is repeated until the target threshold voltage (L1, L2 or L3 in FIG. 2) is reached.

As FIG. 1 suggests, the number of program pulses can be calculated as follows:

$$\text{Number of Program Pluses} = \frac{V_{final} - V_{start}}{V_{step}}$$

As the above relationship indicates, the program time is fixed regardless of the lifecycle of the NAND flash memory. However, in general, the NAND program time is reduced as the number of program-erase (PE) cycles increases. Because of this phenomenon, a cycling guard band (program speed difference between the beginning of life (BOL) condition and the end of life (EOL) condition) needs to be accounted for in selecting an appropriate $V_{start}$ value. As is more clearly described with reference to FIG. 3 further below, the cycling guard band results in selection of a low (conservative) $V_{start}$ in order to avoid over-program (program overshoot) in the EOL scenario. Accordingly, the cycling guard band leads to BOL program time (tPROG) that is longer than necessary. This programming inefficiency is even more pronounced in flash technologies with greater than four levels, such as TLC with 8 states and QLC with 16 states.

The impact of the guard band on the selection of $V_{start}$ can be more clearly seen in FIG. 3. In FIG. 3, the three voltage distribution lines shown by dashed lines represent there different $V_{start}$ distributions corresponding to different stages in the program/erase (PE) life cycle of the flash memory. The first dashed line distribution next to $L_0$ represents the start of life (SOL) distribution. The next one represents the middle of life (MOL) distribution and the far right dashed line represents the end of life (EOL) distribution of $V_{start}$. These three distribution dashed lines are marked in FIG. 3 as SOL, MOL and EOL. As can be seen, with increasing PE cycles, the distribution of $V_{start}$ shifts higher. In other words, the programming of the NAND cell becomes easier and easier as the number of PE cycles increases. However, after the initial $V_{start}$ programing, the $V_{start}$ distribution should never extend beyond the distribution of the $L_1$ state. This is illustrated by the dashed line distribution for $V_{start}$ marked in FIG. 3 as EOL. If the distribution of $V_{start}$ goes beyond the $L_1$ state, an over-shot condition occurs and programming fails. Because of this, $V_{start}$ is set to a lower value to avoid the over-shot programming in the EOL condition. However, the lower Vstart value leads to slower than necessary programming during BOL to MOL cycles, thus resulting in excessively long overall programming performance. This programming inefficiency is even more pronounced in flash technologies with greater than four levels, such as TLC (8 levels) and QLC (16 levels). Thus, there is a need for more efficient programming techniques.

SUMMARY OF EMBODIMENTS

In accordance with one embodiment, a method of programming a flash memory includes the following steps: performing a programing/verifying operation on a plurality of memory cells using a trial program voltage to determine a cell programming speed; modifying a starting program voltage based on the determined cell programming speed; and performing a sequence of programing/verifying operations to program a plurality of selected memory cells to a target program state, wherein in the first of the sequence of programing/verifying operations, a program voltage equal to the modified starting program voltage is used, and the program voltage is incrementally increased from the modified starting program voltage in subsequent programing/verifying operations until the plurality of selected memory cells are programmed to the target state.

In some variations, the starting program voltage is set to the trial program voltage less a delta voltage, the delta voltage representing a difference between the uptail voltage of the trial program voltage distribution and an uptail voltage of a threshold voltage distribution corresponding to one of a plurality of cell states.

In other variations, both the trial program voltage and the uptail voltage of the threshold voltage distribution are constant voltages.

In still other variations, the trial program voltage is selected so that an uptail of the trial program voltage distribution is greater than an uptail of a first threshold voltage distribution corresponding to lowest program state in a plurality of distinct program states, and is smaller than an uptail of the last threshold voltage distribution corresponding to the highest program state in the plurality of distinct program states.

In accordance with another embodiment, a method of programming a flash memory includes: programming a plurality of memory cells by applying a trial program voltage to the plurality of memory cells; performing multiple program verify operations to determine an uptail voltage of the trial program voltage distribution for the programmed plurality of memory cells;

and programming a plurality of memory cells using a starting program voltage, wherein the starting program voltage is set to the trial program voltage less a delta voltage, the delta voltage representing a difference between the uptail voltage of the trial program voltage distribution and an uptail voltage of a threshold voltage distribution corresponding to one of a plurality of cell states.

In one variation, the trial program voltage is selected so that an uptail of the trial program voltage distribution is greater than an uptail of a first threshold voltage distribution corresponding to lowest program state in a plurality of distinct program states, and is smaller than an uptail of the last threshold voltage distribution corresponding to the highest program state in the plurality of distinct program states.

In another variations, performing multiple program verify operations includes performing a binary search to determine the uptail voltage of the trial program voltage distribution.

In accordance with still another embodiment, a method of programming a flash memory includes: programming a plurality of memory cells by applying a trial program voltage to the plurality of memory cells; determining an uptail voltage of the trial program voltage distribution for the programmed plurality of memory cells; obtaining a voltage difference between the uptail of the trial program voltage distribution and an uptail voltage of a threshold voltage distribution corresponding to one of a plurality of cell states; reducing the trial program voltage by an amount equal to the obtained voltage difference; setting a value of a starting program voltage to the reduced trial program voltage; and performing a sequence of programing/verifying operations to program a plurality of selected memory cells to a target program state, wherein in the first of the sequence of programing/verifying operations, a program voltage equal to the starting program voltage is used.

In one variation, the trial program voltage is selected so that an uptail of the trial program voltage distribution is greater than an uptail of a first threshold voltage distribution corresponding to lowest program state in a plurality of distinct program states, and is smaller than an uptail of the last threshold voltage distribution corresponding to the highest program state in the plurality of distinct program states.

In another variation, the uptail voltage of the trial program voltage distribution is determine using a binary search.

DETAILED DESCRIPTION OF EMBODIMENTS

Figure 1:
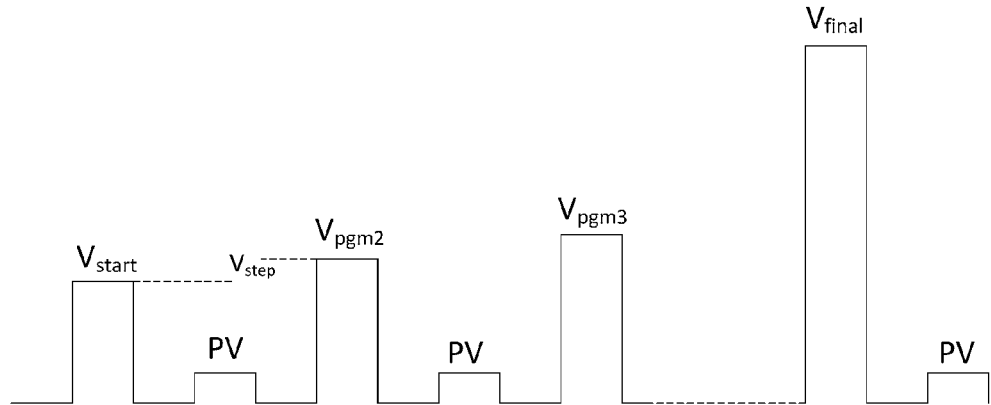
FIG. 1 is a simplified timing diagram of conventional incremental step pulse programming ISPP technique.
Figure 2:
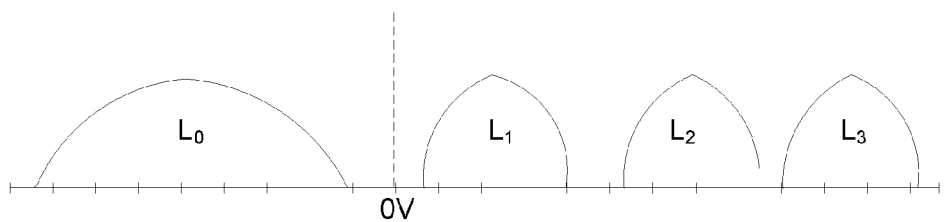
FIG. 2 is a diagram showing the four threshold voltage distributions for a 2-bit per cell flash memory where $L_0$ represents the erased state and $L_1$, $L_2$ and $L_3$ represent 3 program states.
Figure 3:
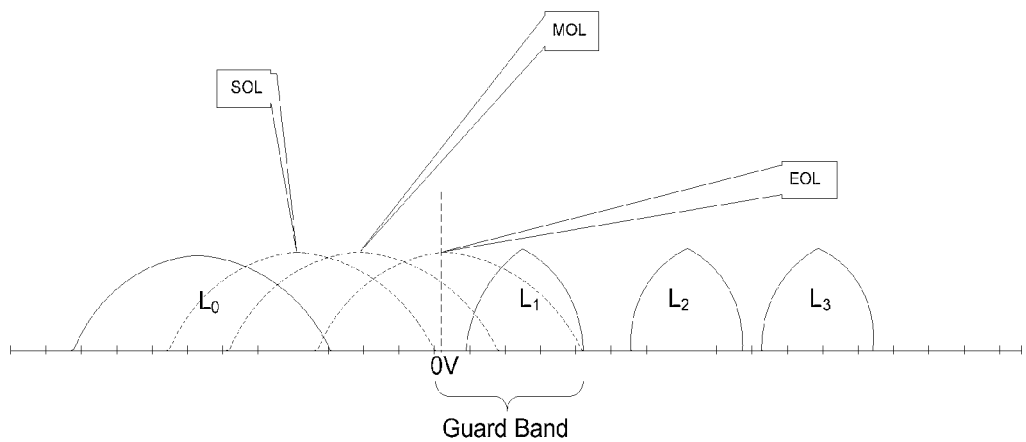
FIG. 3 is a diagram showing the guard banding that is needed in order to prevent program over-shoot in the end of life (EOL) cycle of flash memories.
Figure 4:
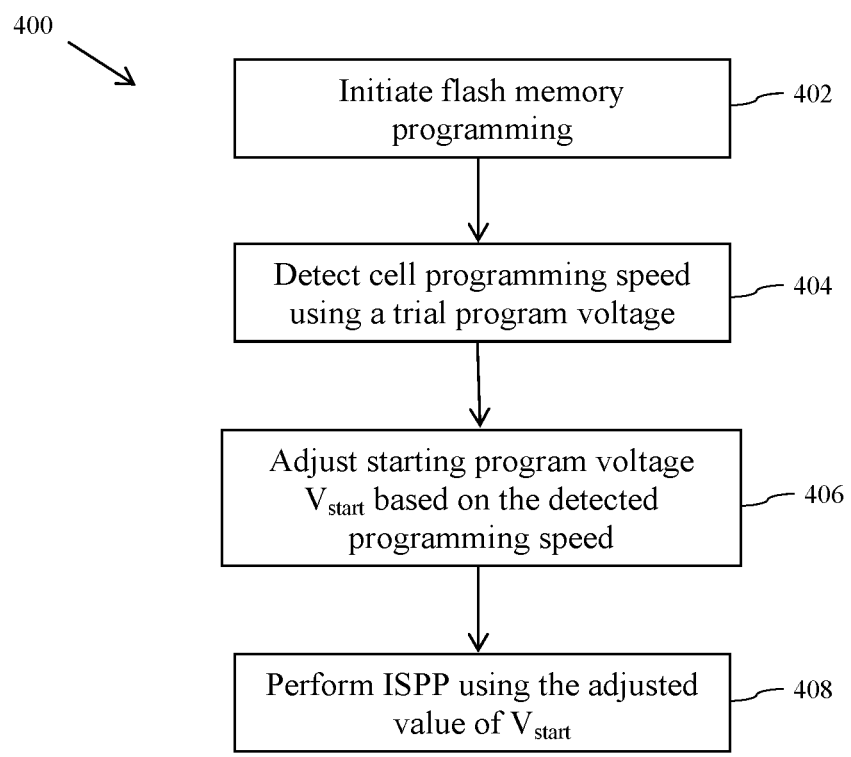
FIG. 4 is a flow chart showing the adaptive programming technique according to some embodiments.

In this disclosure, an adaptive programming method for programming flash memories is described that significantly reduces the overall programming time with minimal overhead. FIG. 4 is a flow chart 400 showing the adaptive programming technique, according to some embodiments. At step 402, the flash memory programming is initiated. Initially, the cell programming speed is detected using a trial program voltage (step 404). The starting program voltage $V_{start}$ is then adjusted based on the detected cell programming speed (step 406). The ISPP is then carried out using the adjusted value for $V_{start}$. This technique enables varying $V_{start}$ at different stages of the life of a flash memory device to account for changes in programming characteristics of the memory cell. For example, in the start of life (SOL) of the memory device when programming is faster as compared to the end of life (EOL) of the memory device, the adaptive technique results in a higher $V_{start}$ value that would help reduce the number of programing/verifying iterations to program the memory cells to the desired states. A more detailed implementation of the adaptive programming method, according to some embodiments, may be as follows: a programing/verifying operation is performed using a trial program voltage to determine a cell programming speed; a starting program voltage is modified based on the determined cell programming speed; and a sequence of programing/verifying operations are then performed to program a number of selected memory cells to a target program state, wherein in the first one of the sequence of programing/verifying operations, a program voltage equal to the modified starting program voltage is used, and the program voltage is then incrementally increased from the modified starting program voltage in subsequent programing/verifying operations until the selected memory cells are programmed to the target state. In some embodiments, the trial program voltage is a fixed voltage during the life of the memory device, and may be selected based on characterization of the NAND memory cells. In such embodiments, the value for the trial program voltage may be stored in a permanent storage location in the flash memory device during manufacturing of the flash memory device, or may be programmed into nonvolatile storage locations after manufacturing of the memory device. In other embodiments, the adaptive programming technique is carried out according to preset policies that dictate the time frames during the life cycle of the flash memory device that the adaptive programming technique is carried out. These and other embodiments of the adaptive programming technique are described more fully with reference to FIGS. 5-11 next.

Figure 5:
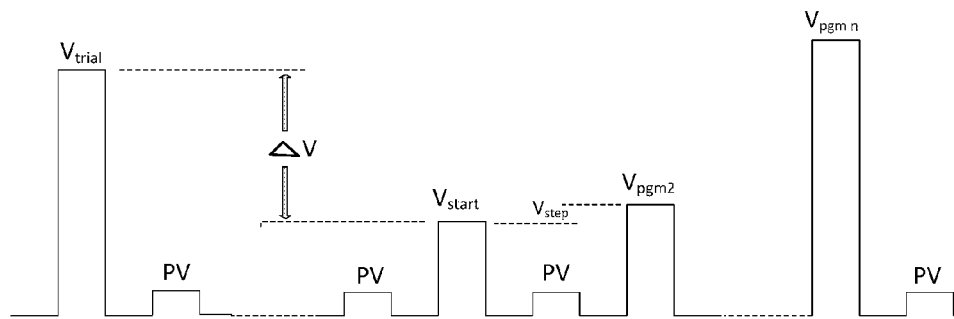
FIG. 5 is a timing diagram illustrating the adaptive programming scheme, according to some embodiments.

FIG. 5 is a timing diagram illustrating the adaptive programming scheme, according to some embodiments. A trial program voltage $V_{trial}$ is used at the beginning of the programming routine in order to determine the optimal $V_{start}$ value. As shown in FIG. 5, after the initial $V_{trial}$ programming, the uptail of the $V_{trial}$ distribution ($V_{trialup}$) is detected using multiple program verify PV (or read) operations. In some embodiments, a binary search may be performed to minimize the number of read operations needed to determine $V_{trialup}$. Also a tolerance may be applied with which the erratic programmed cells can be ignored to make the detection of $V_{trialup}$ conservative. For example, a tolerance limit of up to five bit erratic cells which reside outside the normal distribution can be set, particularly since there is ECC in the flash controller side to correct erratic programmed cells.

Figure 6:
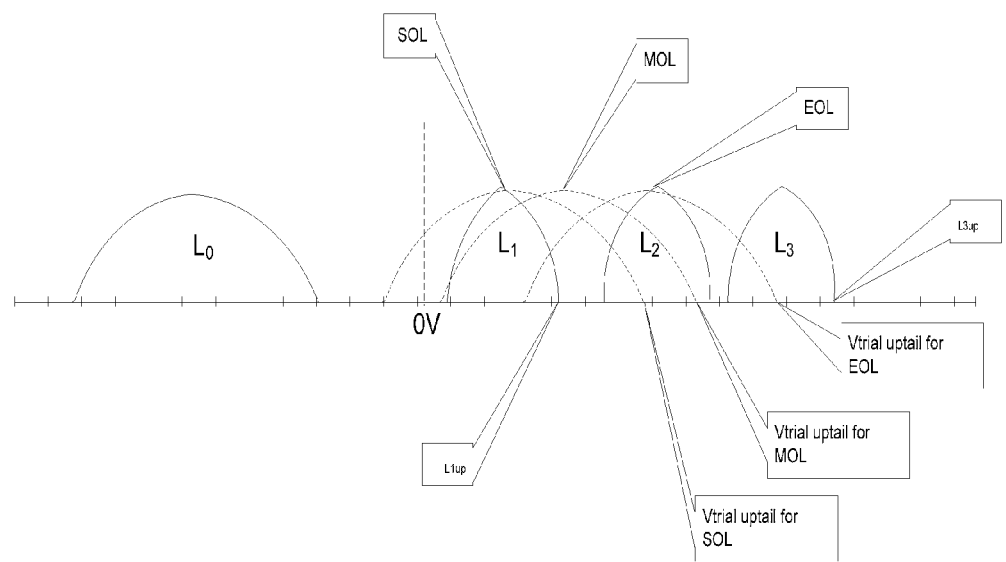
FIG. 6 is a diagram illustrating some of the factors that need to be considered when selecting a value for the trial program voltage $V_{trial}$, according to some embodiments.

In some embodiments, $V_{trial}$ may be a fixed voltage throughout the life of the flash memory, and could be derived from NAND cell characterization. In such embodiments, a value may be selected for $V_{trial}$ that ensures that the $V_{trial}$ voltage distribution at the EOL cycle falls within the voltage distribution of all program states. This is illustrated in FIG. 6. In FIG. 6, the three voltage distribution lines shown by dashed lines represent there different $V_{trial}$ distributions corresponding to different stages in the program/erase (PE) life cycle of the flash memory. The first dashed line distribution to the right of $L_0$ represents the start of life (SOL) distribution; the next one represents the middle of life (MOL) distribution; and the far right dashed line represents the end of life (EOL) distribution of $V_{trial}$. These three distribution dashed lines are marked in FIG. 6 as SOL, MOL and EOL. As expected, with increasing PE cycles, the distribution of $V_{trial}$ shifts higher reflecting the higher speed at which the NAND cell programs. The uptail of $V_{trial}$ distribution ($V_{trialup}$) for each of the SOL, MOL and EOL distributions is also marked in FIG. 6. As depicted in FIG. 6, through NAND cell characterization, a proper $V_{trial}$ voltage can be selected so that its distribution uptail through the flash memory life cycle ranges between the uptail of L1 ($L_{1up}$) and the uptail of L3 ($L_{3up}$). This prevents over-program conditions during the EOL cycle.

If the uptail of $L_1$ distribution is defined by $V_{L1up}$, and the uptail of $V_{trial}$ distribution is defined by $V_{trialup}$, then the difference between $V_{trial}$ $V_{L1up}$ would be:

$$\Delta V = V_{trialup} - V_{L1up}$$

The value for the starting program voltage $V_{start}$ can be set as follows:

$$V_{start} = V_{trial} - \Delta V$$

As depicted in FIG. 5, once the value for $V_{start}$ is determined, the normal ISPP programming can be carried out using the adjusted value of $V_{start}$. This adaptive determination of $V_{start}$ results in optimum programming time tPROG at different stages of flash memory life without the need for external control, for example, by the SSD controller, and with minimal overhead.

Figure 7:
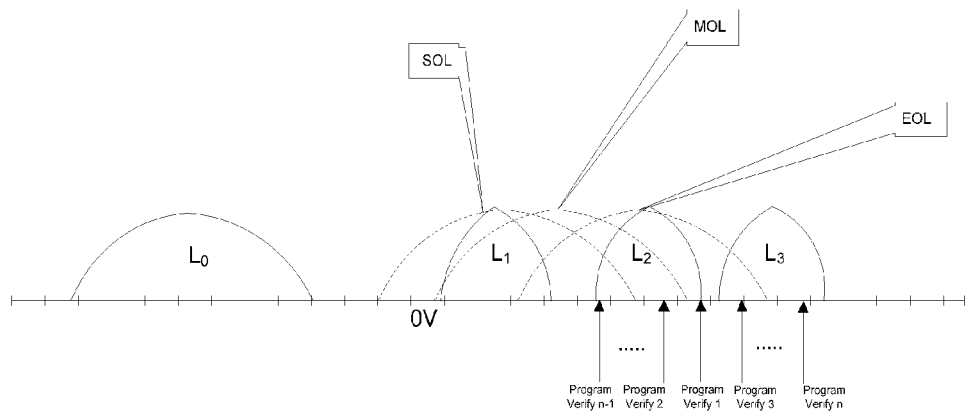
FIG. 7 is a diagram illustrating the multiple verify operations that may be carried out to determine the uptail of the $V_{trial}$ distribution $V_{trialup}$, according to some embodiments.
Figure 8:
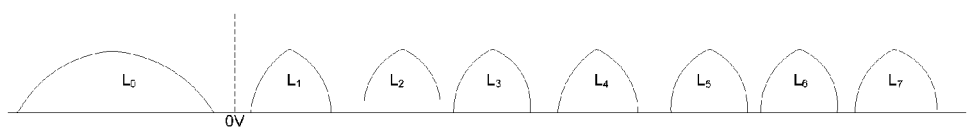
FIG. 8 is a diagram showing the eight threshold voltage distributions for a 3-bit per cell flash memory (TLC), where $L_0$ represents the erased state and $L_1$ to $L_7$ represent 7 program states.
Figure 9:
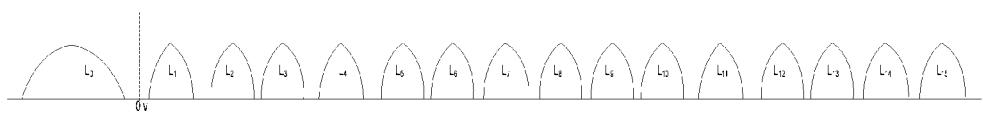
FIG. 9 is a diagram showing the 16 threshold voltage distributions for a 4-bit per cell flash memory (QLC), where $L_0$ represents the erased state and $L_1$ to $L_{15}$ represent 15 program states.

FIG. 7 illustrates the multiple verify operations that may be carried out to determine the uptail of the $V_{trial}$ distribution $V_{trialup}$. As can be seen, multiple program verify PV operations are carried out to find $V_{trialup}$. A binary search may be used to shorten the search time. It is noted that similar to $V_{trialup}$ which is a fixed value throughout the life of the flash memory, the value used for $V_{L1up}$ in the above equations is also a fixed value throughout the life of the flash memory. Similar to $V_{trialup}$, the value for $V_{L1up}$ can be determined based on characterization of the flash memory cells, and such value may be stored in a permanent storage location in the flash memory device during manufacturing of the flash memory device, or may be programmed into nonvolatile storage locations after manufacturing of the memory device.

The adaptive technique is particularly useful in 3D NAND technology in which one-shot program (defining every cell state by one program time—tPROG) can be used and the 3D NAND is free from cell-to-cell interference. Further, $V_{trial}$ can be applied to determine the program speed at specific points in time during the life cycle of the flash memory device (e.g., after specific numbers of program/erase (PE) cycles). Different policies can be set for different types of flash devices. For example, in 2D NAND, a different algorithm may be used since 2D NAND architecture has floating gate to floating gate interference between adjacent the cells.

In some embodiments, when applying the $V_{trial}$ voltage to determine the program speed, care must be taken to apply $V_{trial}$ only to the highest $V_{th}$ distribution target (in the above example, $L_3$ for MLC). All other target levels are to be program-inhibited so that the data in the levels other the highest level are not corrupted.

While the adaptive programming technique is described above in the context of a 4 level cell technology (MLC), the technique can be applied to TLC (8 level cells—FIG. 8) and QLC (16 level cells FIG. 9) technologies. In these technologies, $V_{trial}$ needs to be applied to $L_7$ for TLC and to $L_{15}$ for QLC, respectively. However, it is not necessary to target the highest level when determining $V_{start}$. For instance, in TLC, level $L_6$ can be targeted when determining $V_{start}$ value, which is a reasonably high enough level for the $V_{trial}$ programming, instead of targeting L7.

Figure 10:
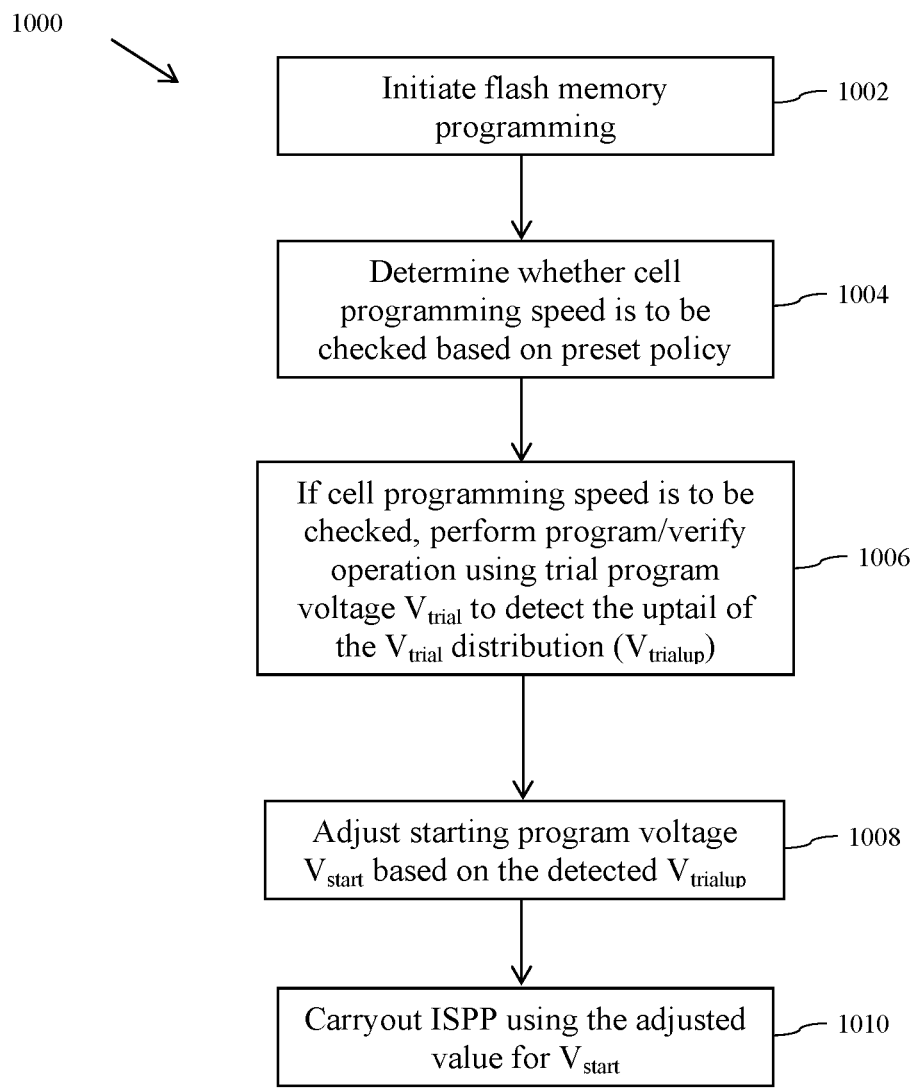
FIG. 10 is a flow chart showing the adaptive programming method according to some embodiments.

FIG. 10 is a flow chart illustrating the adaptive programming technique, in accordance with some embodiments. In step 1002, flash memory programming is initiated. In step 1004, preset policies are checked to determine whether programming speed is to be checked. In step 1006, if it is determined that the programming speed is to be checked, a programming operation is carried out using $V_{trial}$ followed by multiple program verify operations to detect the uptail of the Vtrial ($V_{trialup}$) distribution. In step 1008, the starting program voltage $V_{start}$ is adjusted based on the detected $V_{trialup}$. In step 1010 the ISPP routine is carried out using the adjusted value of $V_{start}$.

Thus, the disclosed programming scheme adaptively adjusts the $V_{start}$ for Incremental Step Pulse Programming, which significantly improves the program time, especially in the early stages of the life of the flash device. To determine the program speed at different stages of the NAND life, the optimal starting program voltage $V_{start}$ is determined using trial programing $V_{trial}$. In addition, a group of policies as to when to apply the trial programming may be employed so that the overhead related to the trial programming could be minimized. In the case of TLC and beyond (e.g., QLC), finer step sizes need to be used to realize tighter $V_{th}$ distribution. This means many numbers of program pulses are needed. By adding one extra trial programming pulse and multiple verifies at different stages of the life of the memory device, a consistent and optimum tPROG time can be obtained over the life time (PE cycles) of a flash memory device.

From the SSD controller perspective, the present invention is advantageous in that the ISPP related parameters (e.g., $V_{pgm\_start}$, $V_{step}$) do not need to be adjusted by the controller at different PE cycles over the life of eth flash memory device. Since the NAND flash adjusts those parameters intelligently (by the adaptive technique disclosed herein), the possibility of errors can be eliminated and variations in tPROG over the life of the flash memory can be minimized.

Figure 11:
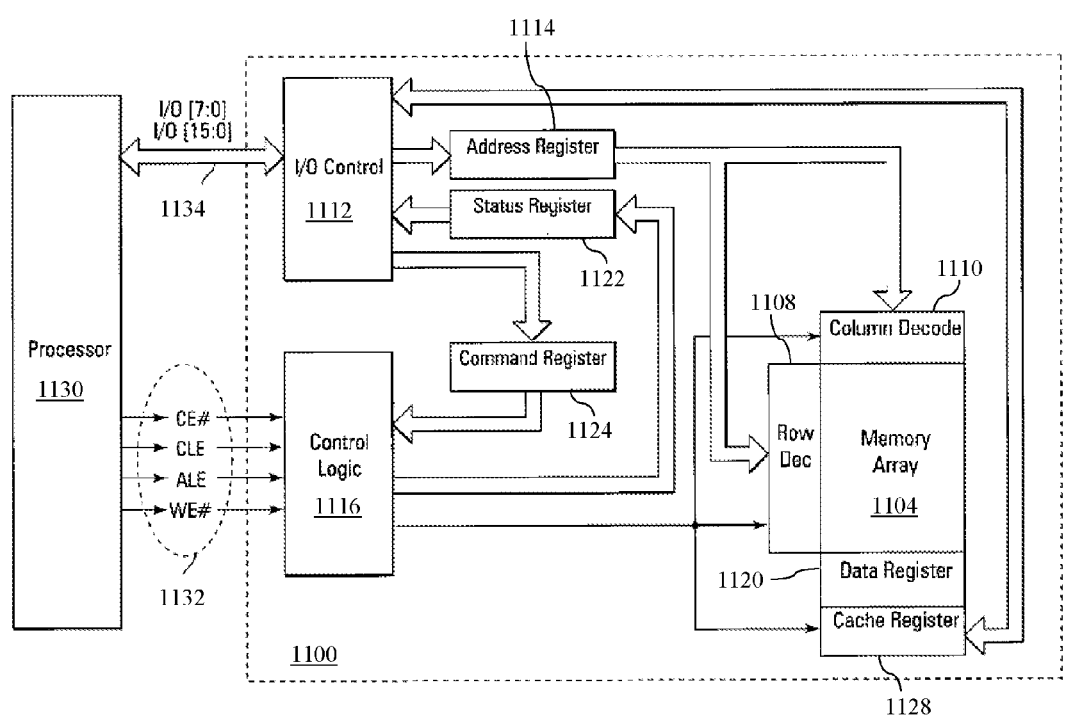
FIG. 11 is a simplified block diagram of a NAND flash memory device in which the adaptive programming technique is implemented, according to some embodiments.

FIG. 11 is a simplified block diagram of NAND flash memory device 1100 in which the adaptive programming technique may be implemented, according to some embodiments. In FIG. 11, flash memory device 1100 is in communication with processor 1130 as part of an electronic system. Processor 1130 may be a memory controller or other external host device. Memory device 1100 includes an array of memory cells 1104 arranged in rows and columns. Row decoder 1108 and column decoder 1110 are provided to decode address signals for selecting memory cells in memory array 1104. Memory device 1100 also includes input/output (I/O) control circuitry 1112 and control logic block 1116 to manage input of commands, addresses and data to memory device 1100 as well as output of data and status information from memory device 1100. Address register 1114 is in communication with I/O control circuitry 1112, and row decoder 1108 and column decoder 1110 to latch the incoming address signals prior to decoding. Command register 1124 is in communication with I/O control circuitry 1112 and control logic 1116 to latch incoming commands. Control logic 1116 controls access to memory array 1104 in response to the commands and generates status information for external processor 1130.

Control logic 1116 is also in communication with cache register 1118. Cache register 1118 latches data, either incoming or outgoing, as directed by control logic 1116 to temporarily store data while memory array 1104 is being written to or read from. During a write operation, data is passed from cache register 1118 to data register 1120 for transfer to memory array 1104. New data is then latched in cache register 1118 from I/O control circuitry 1112. During a read operation, data is passed from cache register 1118 to I/O control circuitry 1112 for output to the external processor 1130. New data is then passed from data register 1120 to cache register 1118. Status register 1122 is in communication with I/O control circuitry 1112 and control logic 1116 to latch the status information for output to processor 1130.

Memory device 1100 receives control signals at control logic 1116 from processor 1130 over control link 1132. The control signals may include at least chip enable CE#, a command latch enable CLE, an address latch enable ALE, and a write enable WE#. Memory device 1100 receives command signals (which represent commands), address signals (which represent addresses), and data signals (which represent data) from processor 1130 over a multiplexed input/output (I/O) bus 1134 and outputs data to processor 1130 over I/O bus 1134.

For example, the commands are received over input/output (I/O) pins [0:7] of I/O bus 1134 at I/O control circuitry 1112 and are written into command register 1124. The addresses are received over input/output (I/O) pins [0:7] of bus 1134 at I/O control circuitry 1112 and are written into address register 1114. The data are received over input/output (I/O) pins [0:7] for an 8-bit device or input/output (I/O) pins [0:15] for a 16-bit device at I/O control circuitry 1112 and are written into cache register 1118. The data are subsequently written into data register 1120 for programming memory array 1104. In some embodiments, cache register 1118 may be omitted, and the data are written directly into data register 1120. Data are also output over input/output (I/O) pins [0:7] for an 8-bit device or input/output (I/O) pins [0:15] for a 16-bit device.

In accordance with some embodiments, control logic 1116 is configured to monitor preset policies (e.g., programming pulse counts and/or number of program/erase cycles), and to adjust the starting program voltage $V_{start}$ in accordance with the preset policies and the technique described above. Logic circuit may be implemented in flash memory device 1100 to implement the process steps outlined above for determining $V_{start}$. Such logic circuit may be coupled to communicate with control logic block 116 and memory array 1104. Further, memory device 1100 may be configured to permanently store the fixed values for $V_{trialup}$ and $V_{L1up}$. These values may be stored in specific memory locations in memory array 1104, or in nonvolatile storage units or latches located outside memory array 1104.

It will be appreciated by those skilled in the art that additional circuitry and signals can be provided, and that the memory device of FIG. 11 has been simplified for purposes of clarity. Additionally, while specific I/O pins are described in accordance with popular conventions for receipt and output of the various signals, it is noted that other combinations or numbers of I/O pins may be used in the various embodiments. Also, implementation of the adaptive technique disclosed herein is not limited to the particular type of memory device or memory architecture that is shown in FIG. 11, and may be implemented in other nonvolatile memory devices and architectures that would enjoy the benefits of the adaptive technique.

The embodiments disclosed herein are thus not to be limited in scope by the specific embodiments described. Various modifications of the embodiments of the present invention, in addition to those described herein, will be apparent to those of ordinary skill in the art from the foregoing description and accompanying drawings. Further, although some of the embodiments of the present invention have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A method of programming a flash memory, the method comprising:
    performing a programing/verifying operation on a plurality of memory cells using a trial program voltage to determine a cell programming speed;
    modifying a starting program voltage based on the determined cell programming speed; and
    performing a sequence of programing/verifying operations to program a plurality of selected memory cells to a target program state, wherein in the first of the sequence of programing/verifying operations, a program voltage equal to the modified starting program voltage is used, and the program voltage is incrementally increased from the modified starting program voltage in subsequent programing/verifying operations until the plurality of selected memory cells are programmed to the target state.

2. The method of claim 1 wherein the trial program voltage is a constant voltage over the life of the flash memory.

3. The method of claim 1 wherein the starting program voltage is set to the trial program voltage less a delta voltage, the delta voltage representing a difference between the uptail voltage of the trial program voltage distribution and an uptail voltage of a threshold voltage distribution corresponding to one of a plurality of cell states.

4. The method of claim 1 wherein both the trial program voltage and the uptail voltage of the threshold voltage distribution are constant voltages.

5. The method of claim 1 where the trial program voltage is selected so that an uptail of the trial program voltage distribution is greater than an uptail of a first threshold voltage distribution corresponding to lowest program state in a plurality of distinct program states, and is smaller than an uptail of the last threshold voltage distribution corresponding to the highest program state in the plurality of distinct program states.

6. A method of programming a flash memory, the method comprising:
   programming a plurality of memory cells by applying a trial program voltage to the plurality of memory cells;
   performing multiple program verify operations to determine an uptail voltage of the trial program voltage distribution for the programmed plurality of memory cells; and
   programing a plurality of memory cells using a starting program voltage, wherein the starting program voltage is set to the trial program voltage less a delta voltage, the delta voltage representing a difference between the uptail voltage of the trial program voltage distribution and an uptail voltage of a threshold voltage distribution corresponding to one of a plurality of cell states.

7. The method of claim 6 wherein both the trial program voltage and the uptail voltage of the threshold voltage distribution are constant voltages.

8. The method of claim 6 where the trial program voltage is selected so that an uptail of the trial program voltage distribution is greater than an uptail of a first threshold voltage distribution corresponding to lowest program state in a plurality of distinct program states, and is smaller than an uptail of the last threshold voltage distribution corresponding to the highest program state in the plurality of distinct program states.

9. The method of claim 6 wherein performing multiple program verify operations includes performing a binary search to determine the uptail voltage of the trial program voltage distribution.

10. A method of programming a flash memory, the method comprising:
    programming a plurality of memory cells by applying a trial program voltage to the plurality of memory cells;
    determining an uptail voltage of the trial program voltage distribution for the programmed plurality of memory cells;
    obtaining a voltage difference between the uptail of the trial program voltage distribution and an uptail voltage of a threshold voltage distribution corresponding to one of a plurality of cell states;
    reducing the trial program voltage by an amount equal to the obtained voltage difference;
    setting a value of a starting program voltage to the reduced trial program voltage; and
    performing a sequence of programing/verifying operations to program a plurality of selected memory cells to a target program state, wherein in the first of the sequence of programing/verifying operations, a program voltage equal to the starting program voltage is used.

11. The method of claim 10 wherein both the trial program voltage and the uptail voltage of the threshold voltage distribution are constant voltages.

12. The method of claim 10 where the trial program voltage is selected so that an uptail of the trial program voltage distribution is greater than an uptail of a first threshold voltage distribution corresponding to lowest program state in a plurality of distinct program states, and is smaller than an uptail of the last threshold voltage distribution corresponding to the highest program state in the plurality of distinct program states.

13. The method of claim 10 wherein the uptail voltage of the trial program voltage distribution is determine using a binary search.

* * * * *